United States Patent [19]
Takano et al.

[11] Patent Number: 5,940,414
[45] Date of Patent: Aug. 17, 1999

[54] METHOD OF CHECKING CONNECTIONS BETWEEN EACH OF A PLURALITY OF CIRCUIT BLOCKS AND BETWEEN EACH CIRCUIT BLOCK AND A PLURALITY OF EXTERNAL TERMINALS

[75] Inventors: Takayuki Takano; Susumu Nitta, both of Yokohama, Japan

[73] Assignee: Kabushiki Kaisha Toshiba, Kawasaki, Japan

[21] Appl. No.: 08/739,832

[22] Filed: Oct. 30, 1996

[30] Foreign Application Priority Data

Oct. 30, 1995 [JP] Japan ................................. 7-281631

[51] Int. Cl.[6] ...................................................... H04B 17/00
[52] U.S. Cl. ......................................... 371/22.5; 371/22.1
[58] Field of Search .................................. 371/22.1, 22.5, 371/22.31, 48, 67.1; 365/200; 1/201

[56] References Cited

U.S. PATENT DOCUMENTS

| | | | |
|---|---|---|---|
| 5,491,699 | 2/1996 | Scheuermann et al. | 371/22.1 |
| 5,557,573 | 9/1996 | McClure | 365/201 |
| 5,729,553 | 3/1998 | Motohara | 371/22.5 |

Primary Examiner—Phung M. Chung
Attorney, Agent, or Firm—Foley & Lardner

[57] ABSTRACT

A logic circuit has a first circuit block, a second circuit block, and a test circuit composed of a first multiplexer and a second multiplexer. In normal operation mode, the first multiplexer connects the output terminal of the first circuit block to the input terminal of the second circuit block on the basis of the first test signal, and the second multiplexer disconnects the input terminal of the second circuit block from the external output terminal on the basis of the second test signal; in a first test mode for outputting a signal outputted by the first circuit block through the external output terminal, the first multiplexer connects the output terminal of the first circuit block to the input terminal of the second circuit block on the basis of the first test signal, and the second multiplexer connects the input terminal of the second circuit block to the external output terminal on the basis of the second test signal; and in a second test mode for inputting a signal inputted to the second circuit block through the external input terminal, the first multiplexer connects the external input terminal to the input terminal of the second circuit block on the basis of the first test signal, and the second multiplexer disconnects the input terminal of the second circuit block from the external output terminal on the basis of the second test signal. Therefore, the test circuit can inspect whether there exists any erroneous connection relationship in the normal operation mode of the logic circuit, after the test circuit has been connected.

4 Claims, 5 Drawing Sheets

TEST = 0

FIG.5

| CIRCUIT BLOCK A | CIRCUIT BLOCK B | CIRCUIT BLOCK C | CIRCUIT BLOCK D | EXTERNAL TERMINAL |
|---|---|---|---|---|
| A1 | | | | EXT1 |
| A2 | | | | EXT2 |
| A3 | B3 | | | |
| A4 | | | | |
| A5 | | C2 | D1 | |
| | B1 | | | EXT3 |
| | B2 | | D2 | EXT6 |
| | | C1 | | |
| | | C3 | D3 | |
| | | C4 | | EXT5 |
| | | C5 | | EXT4 |

FIG.6

METHOD OF CHECKING CONNECTIONS BETWEEN EACH OF A PLURALITY OF CIRCUIT BLOCKS AND BETWEEN EACH CIRCUIT BLOCK AND A PLURALITY OF EXTERNAL TERMINALS

BACKGROUND OF THE INVENTION

The present invention relates to a method of checking a test circuit provided for testing logic circuits, more specifically to a method of checking connections between each of a plurality of circuit blocks and between each circuit block and a plurality of external terminals. Such a logic circuit and its testing method have been so far proposed that a test circuit is connected to a logic circuit having a plurality of circuit blocks to test the logic circuit for each circuit block. For instance, there exists such a method that a test circuit (e.g., a multiplexer) is connected between an input terminal of a circuit block and an external terminal or between an output terminal of a circuit block and an external terminal, and further an input signal is applied from the outside selectively for each block circuit, to observe or inspect an output signal thereof for each block circuit. In the prior art testing method, it has been possible to apply the input signal to each circuit block selectively from the outside or to transmit the output signal from each circuit block to the outside, by switching the connection relationship between the input and output of the multiplexer appropriately. However, it has been so far impossible to inspect whether there exists any erroneous connection between the circuit blocks and between the circuit block and the external terminal in the normal operation.

In summary, in the prior art logic circuit and its testing method, since it has been impossible to verify whether the connection relationship between the circuit blocks is correct or not in the normal operation, this verification has been so far dependent upon workers' visual inspection. As a result, there exists such a problem in that the erroneous connection between the circuit blocks are overlooked or a long test time is required.

SUMMARY OF THE INVENTION

Accordingly, it is the object of the present invention to provide a method of checking a test circuit provided for testing logic circuits, which can inspect whether there exists erroneous connections between each circuit block and between each circuit block and external terminals, after the test circuit has been connected. Here, the test circuit is connected between the circuit blocks and between each circuit block and the external terminals in such a way that an input signal can be selectively applied to each circuit block from the outside and further an output signal can be selectively transmitted from each circuit block to the outside, respectively.

To achieve the above-mentioned object, the present invention provides a method of testing connection relationship between a plurality of circuit blocks and between each circuit block and a plurality of external terminals, respectively in normal operation, in such a logic circuit that a test circuit is connected to a plurality of the circuit blocks to transmit output signals of the circuit blocks to the outside through external terminals and to receive input signals to the circuit blocks from the outside through the external terminals, which comprises: a step of setting a normal operation mode value to an operation mode setting signal for setting the logic circuit to any one of a normal operation mode and two test modes; a step of inputting the operation mode setting signal to which the normal operation mode value has been set to the test circuit; a step of obtaining connection data by tracing signal paths between the circuit blocks and signal paths between the circuit blocks and the external terminals in sequence; and a step of comparing the obtained connection data with previously prepared normal operation connection data, to check whether or not there exists erroneous connections between each circuit block and between each circuit block and external terminals.

Further, in the step of obtaining connection data by tracing signal paths between the circuit blocks and signal paths between the circuit blocks and the external terminals in sequence, when the connection data related to input terminals of the circuit blocks are required, the connection data are obtained by tracing the signal paths in forward direction that signals are transmitted from the input terminals; when the connection data related to output terminals of the circuit blocks are required, the connection data are obtained by tracing the signal paths in a backward direction that signals are transmitted from the output terminals; and when the connection data related to input and output terminals of the circuit blocks are both required, the connection data are obtained by tracing the signal paths in both the forward direction and the backward direction.

Further, the present invention provides a method of checking connections between circuit blocks and between each circuit block and external terminals having: a first circuit block and a second circuit block; a first multiplexer having two input terminals connected to an output terminal of the first circuit block and an external input terminal; a control terminal for receiving a first test signal; and an output terminal connected to an input terminal of the second circuit block, for connecting any one of the output terminal of the first circuit block and the external input terminal to the input terminal of the second circuit block; and a second multiplexer having an input terminal connected to the input terminal of the second circuit block; a control terminal for receiving a second test signal; and an output terminal connected to an external output terminal, for connecting or disconnecting the input terminal of the second circuit block to or from the external output terminal; in normal operation mode, the first multiplexer connecting the output terminal of the first circuit block to the input terminal of the second circuit block on the basis of the first test signal, and the second multiplexer disconnecting the input terminal of the second circuit block from the external output terminal on the basis of the second test signal; in a first test mode for outputting a signal outputted by the first circuit block through the external output terminal, the first multiplexer connecting the output terminal of the first circuit block to the input terminal of the second circuit block on the basis of the first test signal, and the second multiplexer connecting the input terminal of the second circuit block to the external output terminal on the basis of the second test signal; and in a second test mode for inputting a signal inputted to the second circuit block through the external input terminal, the first multiplexer connecting the external input terminal to the input terminal of the second circuit block on the basis of the first test signal, and the second multiplexer disconnecting the input terminal of the second circuit block from the external output terminal on the basis of the second test signal, which comprises: a step of setting a normal operation mode value to the first and second test signals, respectively; a step of inputting the first and second test signals to which the normal operation mode values have been set, to the first and second multiplexers, respectively; a step of obtaining forward direction connection data by tracing a signal path from the output terminal of the first circuit block to the input terminal of the second circuit block via the first multiplexer and another signal path from the output terminal of the first multiplexer to the external output terminal via the second multiplexer; a step of obtaining backward direction connection data by tracing a signal path from the input terminal of the second circuit block to the output terminal of the first circuit block via the first multiplexer and another signal path from the first multiplexer to the external input terminal; and a step of comparing the forward connection data and the backward connection data with previously-prepared normal connection data, to test the connection relationship in the normal operation mode of the logic circuit.

Further, the first multiplexer comprises: a first NAND circuit having two input terminals for inputting an output signal of the first circuit block and an inverted first test signal; a second NAND circuit having two input terminals for receiving a signal inputted through the external input terminal and the first test signal; and a third NAND circuit having two input terminals connected to output terminals of the first and second NAND circuits, respectively, and an output terminal connected to the input terminal of the second circuit block; and the second multiplexer comprises: a fourth NAND circuit having two input terminals for inputting a signal outputted by the third NAND circuit and the second test signal; a fifth NAND circuit having two input terminals for receiving a signal outputted by another circuit block and an inverted second test signal; and a sixth NAND circuit having two input terminals connected to the output terminals of the first and second NAND circuits, respectively, and an output terminal connected to the external output terminal, and wherein: in the step of inputting the first and second test signals to which the normal operation mode values have been set, to the first and second multiplexers, respectively, the first and second test signals or the inverted first and second test signals are inputted to the first, second, fourth and fifth NAND circuits, respectively; in the step of obtaining the forward direction connection data, tracing a signal path from the output terminal of the first circuit block to the input terminal of the second circuit block via the first and third NAND circuits included in the first multiplexer, and another signal path from the output terminal of third NAND circuit included in the first multiplexer to the external output terminal via the fourth and sixth NAND circuits included in the second multiplexer; and in the step of obtaining the backward direction connection data, tracing a signal path from the input terminal of the second circuit block to the output terminal of the first circuit block via the third and first NAND circuits included in the first multiplexer, and another signal path from the third and second NAND circuits included in the first multiplexer to the external input terminal.

As described above, in the logic circuit and its testing method according to the present invention, it is possible to check whether or not there exists any erroneous connections between each circuit block and between each circuit block and external terminals in the normal operation mode of the logic circuit, after the test circuit has been connected. Therefore, it is possible to secure the inspection of the connection relationship of the normal operation of the logic circuit, while reducing the inspection time markedly, being different from the conventional visual inspection.

BRIEF DESCRIPTION OF THE DRAWINGS

FIG. 5 is an illustration showing an example of the normal operation mode setting data used for the testing method shown in FIG. 4;

FIG. 6 is a table listing an example of the normal operation mode connection data used for the testing method shown in FIG. 4.

DETAILED DESCRIPTION OF THE PREFERRED EMBODIMENTS

The logic circuit and its testing method according to the present invention will be described hereinbelow with reference to the attached drawings.

Figure 1:
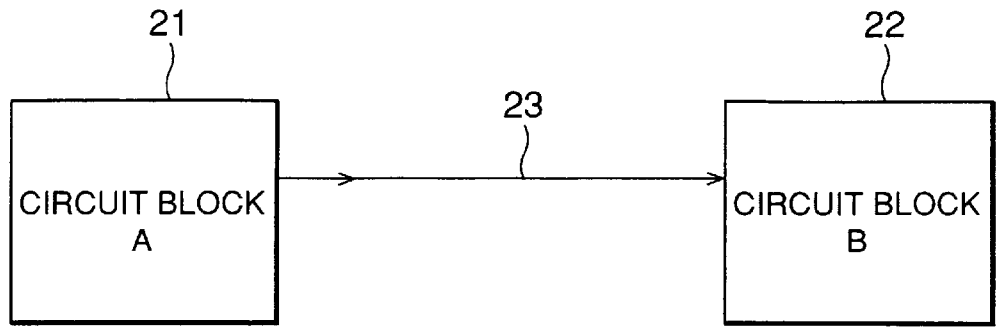
FIG. 1 is a circuit diagram showing a logic circuit to which a test circuit is not yet connected, to which the testing method according to the present invention can be applied.

Prior to the description of the logic circuit having a test circuit according to the present invention, a logic circuit to which no test circuit is connected will be first described with reference to FIG. 1. In the drawing, an output terminal of a circuit block A 21 is connected to an input terminal of a circuit block B 22 via a signal line 23. In the logic circuit as shown in FIG. 1, when a test circuit is connected to the logic circuit as shown in FIG. 2, it is possible to transmit an output signal of the circuit block A 21 to the outside or to apply an input signal to the circuit block B 22 from the outside, respectively and selectively.

Figure 2:
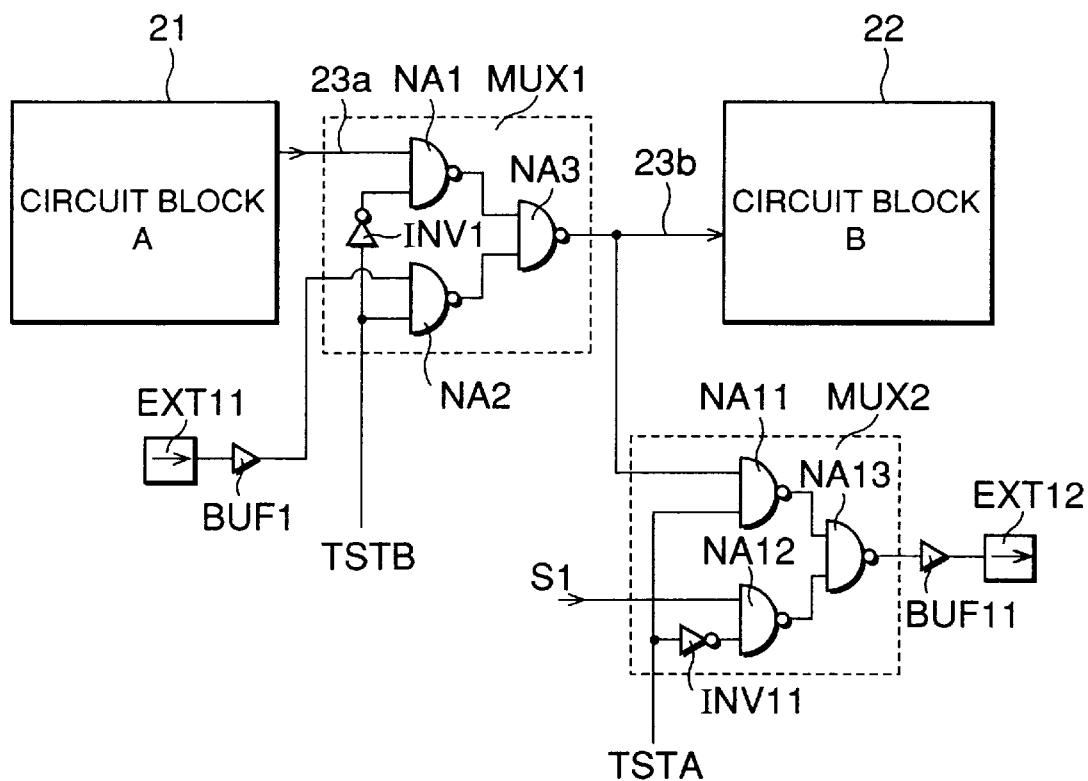
FIG. 2 is a circuit diagram showing an embodiment of the logic circuit according to the present invention.

In more detail, in FIG. 2, a multiplexer MUX1 is connected between an output terminal of the circuit block A 21 and an output terminal of a buffer BUF1 connected to an external input terminal EXT11, and an input terminal of the circuit block B 22. Further, another multiplexer MUX2 is connected between an input terminal of the circuit block B 22 and another buffer BFF11 connected to an external output terminal EXT12.

The multiplexer MUX1 has three NAND circuits NA1, NA2 and NA3, and an inverter INV1. Two input terminals of the NAND circuit NA1 are connected to a signal line 23a connected to the output terminal of the circuit block A 21 and to an output terminal of the inverter INV1 for inputting a test signal TSTB (i.e., an inverted test signal TSTB is inputted to the input terminal thereof). An output terminal of the NAND circuit NA1 is connected to one input terminal of the NAND circuit NA3. Two input terminals of the NAND circuit NA2 are connected to an output terminal of the buffer BUF1 and to an input terminal of the inverter INV1 (i.e., a control terminal to which the test signal TSTB is inputted). An output terminal of the NAND circuit NA2 is connected to the other input terminal of the NAND circuit NA3. Further, an output terminal of the NAND circuit NA3 is connected to the input terminal of the circuit block B 22.

The multiplexer MUX2 has three NAND circuits NA11, NA12 and NA13, and an inverter INV11. Two input terminals of the NAND circuit NA11 are connected to a signal line 23b connected to the input terminal of the circuit block B 22 and to an input terminal of the inverter INV11 (i.e, a control terminal to which another test signal TSTA is inputted). An output terminal of the NAND circuit NA11 is connected to one input terminal of the NAND circuit NA13.

Two input terminals of the NAND circuit NA12 are connected to a signal line (to which a signal S1 is outputted by another circuit block (not shown) and then outputted to the outside in the normal operation mode) and to an output terminal of the inverter INV11 (i.e., an inverted test signal TSTA is inputted to the input terminal thereof). An output terminal of the NAND circuit NA12 is connected to the other input terminal of the NAND circuit NA13. Further, an output terminal of the NAND circuit NA13 is connected to an external output terminal EXT12 via another buffer BUF11.

As described above, since the two multiplexers MUX1 and MUX2 are connected to the two circuit blocks A and B, it is possible to transmit an output signal of the circuit block A 21 through the external output terminal EXT12 or to receive an input signal to the circuit block B 22 through the external input terminal EXT11, respectively and selectively.

The operation of the multiplexer MUX1 and MUX2 will described hereinbelow in both normal operation mode and test operation mode, respectively.

The normal and test operation modes are selected by switching the logic levels of the two test signals TSTA and TSTB both inputted to the two multiplexers AUX1 and AUX2, respectively.

In the normal operation mode, both the test signals TSTA and TSTB are both set to the logic level [0]. Therefore, the multiplexer MUX1 connects the output terminal of the circuit block A 21 to the input terminal of the circuit block B 22. On the other hand, the multiplexer MUX2 disconnects the input terminal of the circuit block B 22 from the external output terminal EXT12.

In this case, further, since the test signal TSTA is inverted by the inverter INV11 into the logic level [1] and then inputted to one input terminal of the NAND circuit NA12, the signal S1 outputted from another circuit block (not shown) to the other input terminal of the NAND circuit NA12 is outputted to the NAND circuit NA13 and further outputted from the external output terminal EXT12 to the outside through the buffer BUF11, with the result that the circuit block A 21 can operate in the normal operation mode without causing any trouble.

In the test mode, the two multiplexers MUX1 and MUX2 are operated as follows: When the output signal of the circuit block A 21 is required to be outputted through the external output terminal EXT12 to the outside, the test signals TSTA is set to the logic level [1] and the test signal TSTB is set to the logic level [0]. Therefore, the output terminal of the circuit block A 21 is connected to the input terminal of the circuit block B 22 on the basis of the test signal TSTB of the logic level [0]. Further, the output terminal of the multiplexer MUX1 is connected to the external output terminal EXT12 through the multiplexer MUX2 and buffer BUF11 on the basis of the test signal TSTA of the logic level [1]. As a result, the signal outputted by the circuit block A 21 can be outputted to the outside through the external output terminal EXT12 for inspection.

Further, since the test signal TSTA is inverted by the inverter INV11 into the logic level [0], and then inputted to one input terminal of the NAND circuit NA12, the signal S1 outputted from another circuit block (not shown) to the other input terminal of the NAND circuit NA12 is not outputted from the NAND circuit NA12.

On the other hand, when the input signal to the circuit block B 22 is required to be inputted selectively through the external input terminal EXT11 from the exterior, the test signals TSTA is set to the logic level [0] and the test signal TSTB is set to the logic level [1]. Therefore, the external input terminal EXT11 is connected to the input terminal of the circuit block B 22 by the multiplexer MUX1, and the input terminal of the circuit block B 22 is disconnected from the external output terminal EXT12. Therefore, it is possible to input the signals to be applied to the circuit block B 22 selectively through the external input terminal EXT11.

Figure 3:
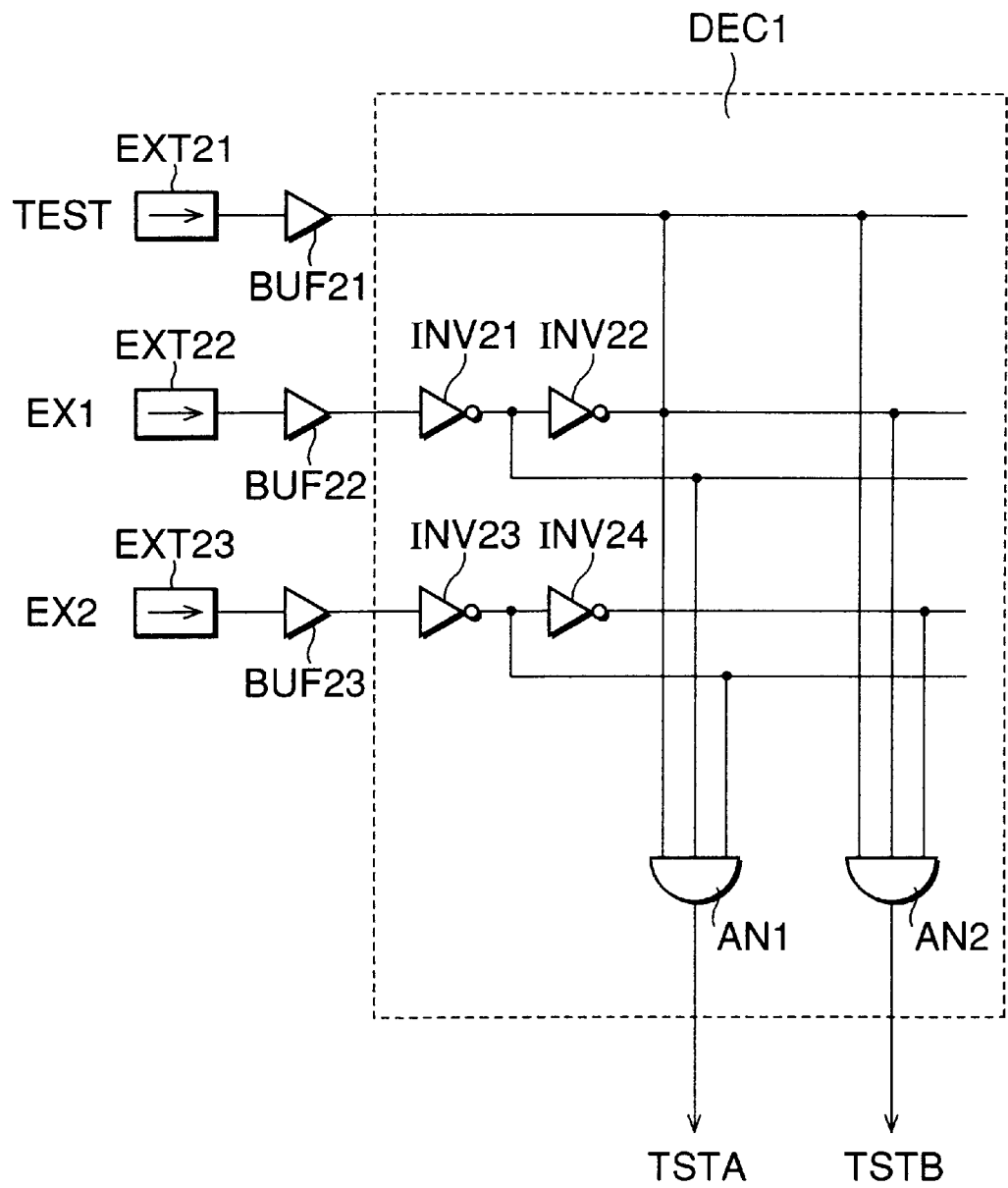
FIG. 3 is a circuit diagram showing a circuit construction for generating two test signals.

A test signal generating circuit for generating the above-mentioned test signals TSTA and TSTB will be described hereinbelow with reference to FIG. 3. In FIG. 3, three external input terminals are provided. To an external input terminal EXT21, an operation mode setting signal TEST for selecting any one of the normal operation mode and the test mode is inputted from the exterior. To the external input terminals EXT22 and EXT23, two multiplexer setting signals EX1 and EX2 for deciding the logic levels of the two test signals TSTA and TSTB, respectively are inputted from the exterior. These three external input terminals EXT21, EXT22 and EXT23 are connected to a decoder DEC1 via three buffers BUF21, BUF22 and BUF23, respectively. The decoder DEC1 generates the two test signals TSTA and TSTB on the basis of three signals TEST, EX1 and EX2 inputted thereto.

The decoder DEC 1 has four inverters INV21 to INV24 and two AND circuits AN1 and AN2. An output terminal of the buffer BUF21 is connected to two first input terminals of the two AND circuits AN1 and AN2, respectively. An output terminal of the buffer BUF22 is connected to a second input terminal of the AND circuit AN1 via the inverter INV21 and to a second input terminal of the AND circuit AN2 via the two inverters INV21 and INV22, respectively. In the same way, an output terminal of the buffer BUF23 is connected to a third input terminal of the AND circuit AN1 via the inverter INV23 and to a third input terminal of the AND circuit AN2 via the two inverters INV23 and INV24, respectively.

In the normal operation mode, the operation mode setting signal TEST is set to the logic level [0] and inputted to the decoder DEC1. Then, the decoder DEC1 generates the two test signals TSTA and TSTB of the logic level [0], irrespective of the logic levels of the two signals EX1 and EX2. In the test operation mode, the external test signal TEST is set to the logic level [1] and inputted to the decoder DEC1. Here, when the output of the circuit block A 21 is required to be tested, the signals EX1 and EX2 are both set to the logic level [0], so that the decoder DEC1 outputs the test signal TSTA of the logic level [1] and the test signal TSTB of the logic level [0]. When the circuit block B 22 is required to be tested by selecting the input signal applied thereto, the signals EX1 and EX2 are both set to the logic level [1], so that the decoder DEC1 outputs the test signal TSTA of the logic level [0] and the test signal TSTB of the logic level [1].

By use of the two test signals TSTA and TSTB generated by the test signal generating circuit as shown in FIG. 3, the outputs of the two multiplexers MUX1 and MUX2 can be switched from the normal operation to the test operation or vice versa.

Here, the method of testing the logic circuit having the test circuit as described above will be explained hereinbelow.

Figure 4:
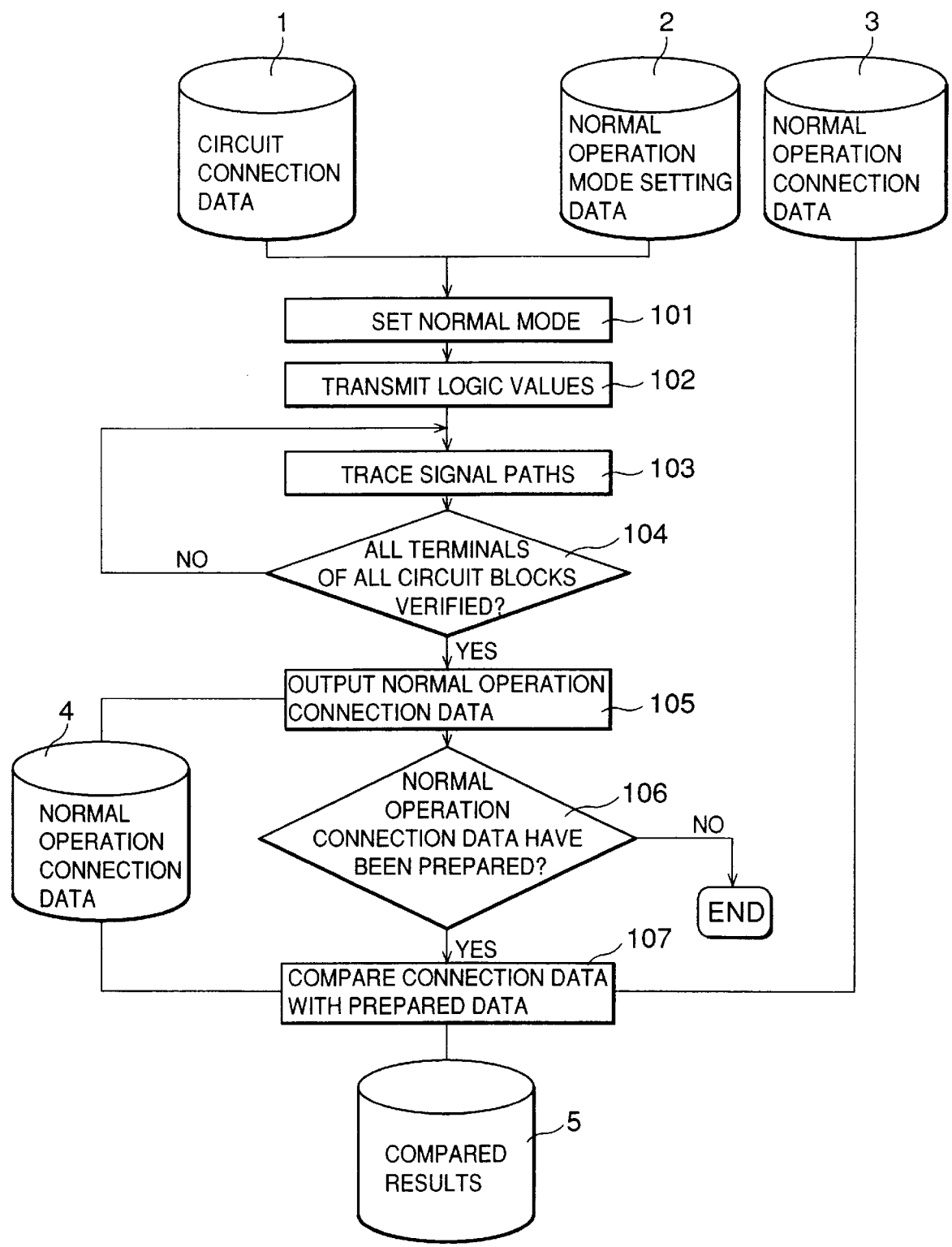
FIG. 4 is a flowchart for assistance in explaining the procedure of testing the first embodiment of the logic circuit (shown in FIG. 2) to which the test circuit is connected.

FIG. 4 is a flowchart showing the test procedure. In FIG. 4, a circuit connection data storing section 1 is memory means for storing data related to the circuit connection of the logic circuit; a normal operation mode setting data storing section 2 is memory means for storing normal operation mode setting data required to switch the operation mode to the normal operation mode or vice versa, and a normal operation connection data storing section 3 is memory means for storing the connection data in the normal operation mode, that is, the connection data between the terminals of the respective circuit blocks and between the respective circuit blocks and the external input/output terminals on condition that the test terminal is not yet connected.

FIG. 5 shows an example of the normal operation mode setting data stored in the normal operation mode setting data memory section 2. In this case, the normal operation mode can be set by setting the operation mode setting signal TEST to the logic level [0]. When set to the logic level [1], the test mode can be set. As described above, the normal operation mode setting data are data indicative of the signal names (or the external input terminal names for inputting the signal names) and the signal levels thereof both required to switch the operation mode to the normal operation mode.

FIG. 6 shows an example of the connection data stored in the normal operation connection data memory section 3. The connection data listed in FIG. 6 relate to a logic circuit as shown in FIG. 7.

Figure 7:
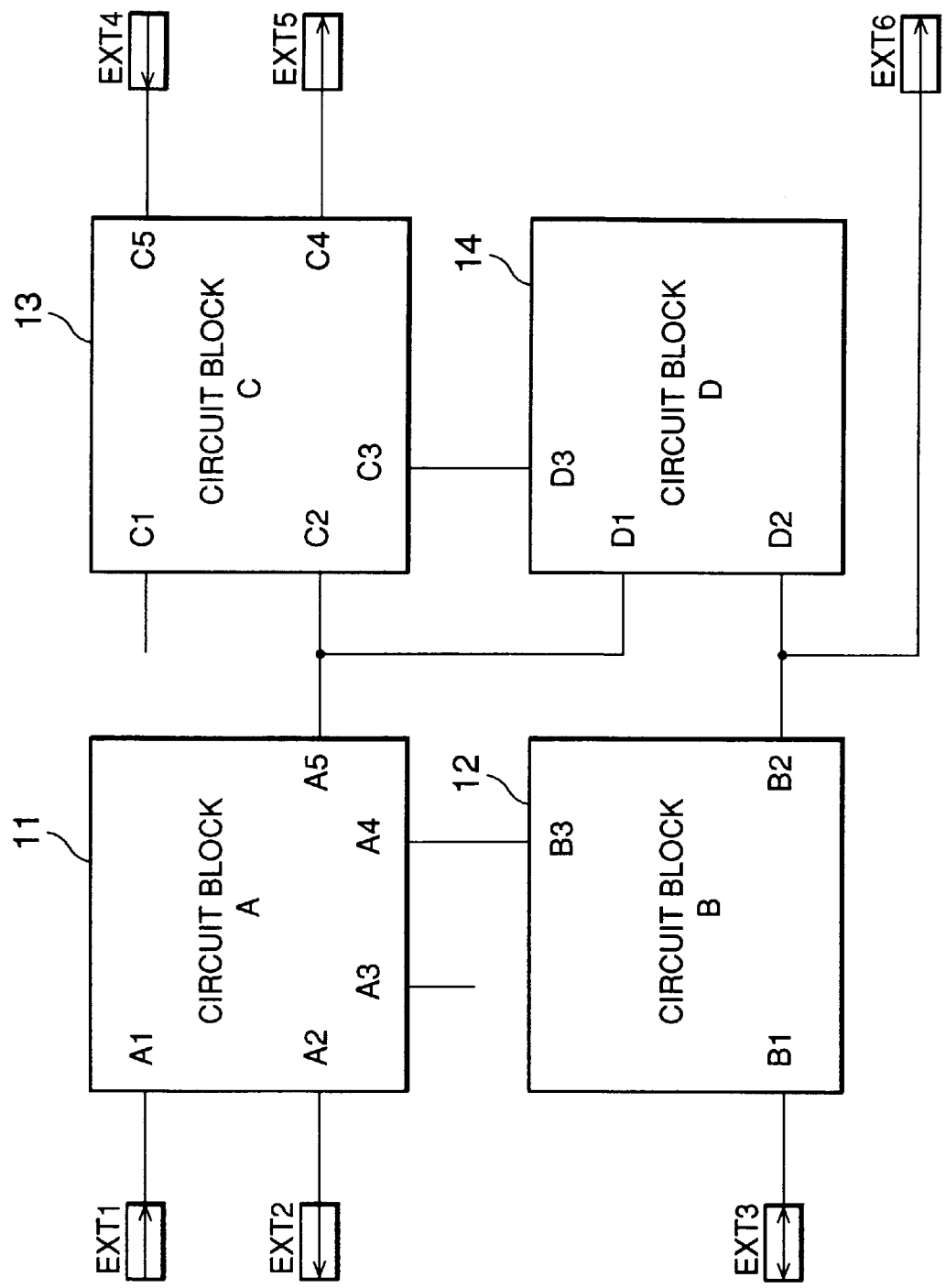
FIG. 7 is a circuit diagram showing another embodiment of the logic circuit, to which the normal operation mode connection data as shown in FIG. 6 can be applied.

To the logic circuit shown in FIG. 7, the test circuit is not yet connected, so that the logic circuit operates in the normal operation mode. In FIG. 7, however, the input and output buffers are both eliminated.

In FIG. 7, a circuit block A 11 has five input/output terminals A1 to A5; a circuit block B 12 has three input/output terminals B1 to B3; a circuit block C 13 has five input/output terminals C1 to C5; and a circuit block D 14 has three input/output terminals D1 to D3, respectively. Further, the six external terminals EXT1 to EXT6 are provided as the external input/output terminals.

The connection data between the input/output terminals of the these circuit blocks A11, B12, C13 and D14 and the six external input/output terminals EXT1 to EXT6 are listed in a table shown in FIG. 6. In the table shown in FIG. 6, in the vertical direction, the input/output terminal names of the respective circuit blocks A, B, C and D and the terminal names of the external input/output terminals EXT1 to EXT 6 are arranged. Further, in the horizontal direction, the connection relationship among these terminals are shown. For instance, when the horizontal direction of the input/output terminal A1 of the circuit block A 11 is seen, only the external input/output terminal EXT1 is found, without listing the other terminal names. This indicates that the input/output terminal A1 of the circuit block A 11 is connected to only the external input/output terminal EXT1. In the same way, when the horizontal direction of the input/output terminal A5 of the circuit block A 11 is seen, the input/output terminal C2 of the circuit block C 13 and the input/output terminal D1 of the circuit block D 14 are found. This indicates that the input/output terminal A5 of the circuit block A 11 is connected to the input/output terminal C2 of the circuit block C 13 and the input/output terminal D1 of the circuit block D 14. Further, in the horizontal direction of the input/output terminal A4 of the circuit block A 11, since no terminal names are fond, this indicates that this input/output terminal A4 is not connected to any terminals.

With reference to FIG. 4 again, in step 101, the normal operation mode setting processing is executed on the basis of the normal operation mode setting data stored in the normal operation mode setting data memory section 2. For instance, as already explained, when the logic level [0] is set to the external input/output terminal TEST, the normal operation mode can be set.

In step 102, logical value transmitting processing is executed to input the normal operation mode setting data [TEST=0] to the test circuit connected to the logic circuit. In practice, in the test signal generating circuit shown in FIG. 3, the logic level [0] is inputted to the external input/output terminal EXT21 and then transmitted to the AND circuits AN1 to AN2, so that the logic values of the test signals TSTA and TSTB are both set to the logic level [0].

Further, in step 103 in FIG. 4, path-trace processing is executed. In this path-trace processing, the signal lines between the input/output terminals of each circuit block and the input/output terminals or the external input/output terminals of other circuit block connected thereto are traced in sequence to check whether these signal lines are activated or not. In other words, the correct circuit connection relationship in the normal operation mode is inspected. In more detail, all the input/output terminals of all the circuit blocks are inspected terminal by terminal as to whether the signal lines between two terminals have been activated or not in sequence. In the case of the logic circuit shown in FIG. 2, for instance, the signal line from the output terminal of the circuit block A 21 to the input terminal of the circuit block B 22 is inspected as to whether activated or not. In the above step 102, since the two test signals TSTA and TSTB are both set to the logic level [0], when these logic values [0] are inputted to the two multiplexers MUX1 and MUX2 respectively, the connection conditions of the two multiplexers MUX1 and MUX2 can be set. Under these connection conditions, the signal lines are traced in sequence along the path from the output terminal of the circuit block A 21 to the input terminal of the circuit block B 22 via the multiplexer MUX1 (i.e., two NAND circuits NA1 and NA3), to inspect whether this path is activated or not.

Here, the above-mentioned path trace processing is a forward direction processing for tracing the signal path in the forward signal path direction from the input side to the output side (in the same direction that the signal is transmitted). After this forward direction processing, a backward direction processing for tracing the signal path in the backward signal path direction from the output side to the input side (in a direction opposite to that the signal is transmitted). That is, the signal line from the input terminal of the circuit block B 22 to the output terminal of the circuit block A 21 via the multiplexer MUX1 (i.e., the NAND circuits NA3 and NA1) is inspected as to whether activated or not. For instance, when the input terminal of the circuit block B 22 is at the logic level [0], it can be understood that the two input terminals of the NAND circuit NA3 are both at the logic level [1]. Further, since the logic level [1] is given to one input terminal of the NAND circuit NA1 via the inverter INV1, it can be understood that the output terminal of the circuit block A 21 is at the logic level [0]. Therefore, under these conditions, it can be clarified that the path from the input terminal of the circuit block B 22 to the output terminal of the circuit block A 21 is activated. In the same way, since the test signal TSTB of the logic level [0] is inputted to one input terminal of the NAND circuit NA2, it can be understood that the external input/output terminal EXT11 and the NAND circuit NA2 are disconnected from each other, irrespective of the logic level of the external input/output terminal EXT11 (i.e. the other input terminal of the NAND circuit NA2). During the path-trace processing as described above, the connection data in the normal operation mode are stored in the normal operation connection data memory section 4.

In step 104 shown in FIG. 4, the completion of the path-trace processing for all the input/output terminals of all the circuit blocks is discriminated. When not yet completed, the processing of the step 103 is repeated until completed.

When completed, the step 104 proceeds to the succeeding step 105. In step 105, the normal operation connection data stored in step 104 are outputted. In this output processing, the stored connection data are outputted in the same output processing as with the case of the data output processing of the normal operation connection data memory section 3 for storing the previously prepared connection data.

Successively, in step 106, a decision processing is executed. This decision processing is executed to check whether the connection data are previously prepared in the normal operation connection data memory section 3 or not. At the stage prior art to the test, since the connection data are not yet prepared therein, the connection data obtained by the path-trace processing executed in step 103 are stored in the normal operation connection data memory section 4 in sequence, and after that the stored connection data are to be used. Further, after the correct connection data have been prepared or stored in the normal operation connection data memory section 3, the completion of the connection data storing processing is decided in step 106, proceeding to step 107.

In step 107, the connection data stored and outputted by the normal operation connection data memory section 4 (obtained by the processing in steps 101 to 105) are compared with the previously-prepared correct connection data stored in the normal operation connection data memory section 3, and the comparison results 5 are outputted.

When the connection data stored in the normal operation connection data memory section 4 match the previously-prepared correct connection data stored in the normal operation connection data memory section 3, the correct normal operation connection relationship can be decided. This indicates that the test circuit is correctly connected to the logic circuit, so that the logic circuit can operate in the normal operation without causing any trouble. On the other hand, when the connection data stored in the normal operation connection data memory section 4 are different from the connection data stored in the memory section 3, this indicates that there exists an erroneous connection relationship in the normal operation mode; that, is, the test circuit is connected to the logic circuit erroneously.

As described above, in the logic circuit and its testing method according to the present invention, it is possible to check whether there exists any erroneous connection relationship in the normal operation mode of the logic circuit, after the test circuit has been connected. Therefore, it is possible to secure the inspection of the connection relationship of the normal operation of the logic circuit, while reducing the inspection time markedly, being different from the conventional visual inspection.

The above-mentioned embodiment has been described only by way of example. Therefore, without being limited only thereto, various modifications can be made in the invention without departing from the spirit and scope thereof. For instance, although the procedure of testing the logic circuit has been explained by taking the case of the logic circuit and the test signal generating circuit as shown in FIGS. 2 and 3, it is of course possible to apply the present invention to the case where the connection relationship of logic circuits other than that shown in FIGS. 2 and 3 are verified in the normal operation mode.

What is claimed is:

1. A method of testing connection relationship between a plurality of circuit blocks and between each circuit block and a plurality of external terminals, respectively in normal operation, in such a logic circuit that a test circuit is connected to a plurality of circuit blocks to transmit output signals of the circuit blocks to the outside through external terminals and to receive input signals to the circuit blocks from the outside through the external terminals, which comprises:

a step of setting a normal operation mode value to an operation mode setting signal for setting the logic circuit to any one of a normal operation mode and two test modes;

a step of inputting the operation mode setting signal to which the normal operation mode value has been set to the test circuit;

a step of obtaining connection data by tracing signal paths between the circuit blocks and signal paths between the circuit blocks and the external terminals in sequence; and a step of comparing the obtained connection data with previously prepared normal operation connection data, to check whether or not there exists erroneous connections between each circuit block, and between each circuit block and the external terminals.

2. The method of testing connection relationship of a logic circuit of claim 1, wherein in the step of obtaining connection data by tracing signal paths between the circuit blocks and signal paths between the circuit blocks and the external terminals in sequence, when the connection data related to input terminals of the circuit blocks are required, the connection data are obtained by tracing the signal paths in forward direction that signals are transmitted from the input terminals;

when the connection data related to output terminals of the circuit blocks are required, the connection data are obtained by tracing the signal paths in a backward direction that signals are transmitted from the output terminals; and when the connection data related to input and output terminals of the circuit blocks are both required, the connection data are obtained by tracing the signal paths in both the forward direction and the backward direction.

3. A method of testing connection relationship of a logic circuit having:

a first circuit block and a second circuit block;

a first multiplexer having two input terminals connected to an output terminal of the first circuit block and an external input terminal; a control terminal for receiving a first test signal; and an output terminal connected to an input terminal of the second circuit block, for connecting any one of the output terminal of the first circuit block and the external input terminal to the input terminal of the second circuit block; and a second multiplexer having an input terminal connected to the input terminal of the second circuit block; a control terminal for receiving a second test signal; and an output terminal connected to an external output terminal, for connecting or disconnecting the input terminal of the second circuit block to or from the external output terminal;

in normal operation mode, the first multiplexer connecting the output terminal of the first circuit block (21) to the input terminal of the second circuit block on the basis of the first test signal, and the second multiplexer (MUX2) disconnecting the input terminal of the second circuit block from the external output terminal on the basis of the second test signal;

in a first test mode for outputting a signal outputted by the first circuit block through the external output terminal, the first multiplexer connecting the output terminal of the first circuit block to the input terminal of the second circuit block on the basis of the first test signal, and the second multiplexer connecting the input terminal of the second circuit block to the external output terminal on the basis of the second test signal; and in a second test mode for inputting a signal inputted to the second circuit block through the external input terminal, the first multiplexer connecting the external input terminal to the input terminal of the second circuit block on the basis of the first test signal, and the second multiplexer disconnecting the input terminal of the second circuit block from the external output terminal on the basis of the second test signal, which comprises:

a step of setting a normal operation mode value to the first and second test signals, respectively;

a step of inputting the first and second test signals to which the normal operation mode values have been set, to the first and second multiplexers, respectively;

a step of obtaining forward direction connection data by tracing a signal path from the output terminal of the first circuit block to the input terminal of the second circuit block via the first multiplexer and another signal path from the output terminal of the first multiplexer to the external output terminal via the second multiplexer;

a step of obtaining backward direction connection data by tracing a signal path from the input terminal of the second circuit block to the output terminal of the first circuit block via the first multiplexer and another signal path from the first multiplexer to the external input terminal; and a step of comparing the forward connection data and the backward connection data with previously-prepared normal connection data, to test the connection relationship in the normal operation mode of the logic circuit.

4. The method of testing the connection relationship of a logic circuit of claim 3, which further comprises a third circuit block, and the first multiplexer comprises:

a first NAND circuit having two input terminals for inputting an output signal of the first circuit block and an inverted first test signal;

a second NAND circuit having two input terminals for receiving a signal inputted through the external input terminal and the first test signal; and a third NAND circuit having two input terminals connected to output terminals of the first and second NAND circuits, respectively, and an output terminal connected to the input terminal of the second circuit block; and the second multiplexer comprises:

a fourth NAND circuit having two input terminals for inputting a signal outputted by the third NAND circuit and the second test signal;

a fifth NAND circuit having two input terminals for receiving a signal outputted by the third circuit block and an inverted second test signal; and a sixth NAND circuit having two input terminals connected to the output terminals of the first and second NAND circuits, respectively, and an output terminal connected to the external output terminal; and wherein:

in the step of inputting the first and second test signals to which the normal operation mode values have been set, to the first and second multiplexers, respectively, the first and second test signals or the inverted first and second test signals are inputted to the first, second, fourth and fifth NAND circuits, respectively;

in the step of obtaining the forward direction connection data, tracing a signal path from the output terminal of the first circuit block to the input terminal of the second circuit block via the first and third NAND circuits included in the first multiplexer, and another signal path from the output terminal of third NAND circuit included in the first multiplexer to the external output terminal via the fourth and sixth NAND circuits included in the second multiplexer; and in the step of obtaining the backward direction connection data, tracing a signal path from the input terminal of the second circuit block to the output terminal of the first circuit block via the third and first NAND circuits included in the first multiplexer, and another signal path from the third and second NAND circuits included in the first multiplexer to the external input terminal.

* * * * *